United States Patent
Gardner et al.

(10) Patent No.: US 6,531,364 B1
(45) Date of Patent: *Mar. 11, 2003

(54) ADVANCED FABRICATION TECHNIQUE TO FORM ULTRA THIN GATE DIELECTRIC USING A SACRIFICIAL POLYSILICON SEED LAYER

(75) Inventors: Mark I. Gardner, Cedar Creek, TX (US); H. Jim Fulford, Jr., Austin, TX (US); Charles E. May, Austin, TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,703

(22) Filed: Aug. 5, 1998

(51) Int. Cl.[7] .................. H01L 21/336; H01L 29/792
(52) U.S. Cl. .................. 438/287; 438/591; 438/775; 438/783; 257/324; 257/411
(58) Field of Search ................... 438/303, 398, 438/769, 775–777, 791, 287, 591, 783; 257/324, 411

(56) References Cited

U.S. PATENT DOCUMENTS

| | | | |
|---|---|---|---|
| 4,098,618 A | | 7/1978 | Crowder et al |
| 4,287,661 A | * | 9/1981 | Stoffel .................. 438/303 |
| 4,551,910 A | | 11/1985 | Patterson |
| 4,578,128 A | | 3/1986 | Mundt et al. |
| 4,682,407 A | | 7/1987 | Wilson et al. |
| 4,701,423 A | | 10/1987 | Szluk |
| 4,707,721 A | | 11/1987 | Ang et al. |
| 4,729,009 A | | 3/1988 | Ang |
| 4,743,566 A | | 5/1988 | Bastiaens et al. |
| 4,774,197 A | | 9/1988 | Haddad et al. |
| 4,776,925 A | | 10/1988 | Fossum et al. |
| 4,808,261 A | | 2/1989 | Ghidini et al. |
| 4,851,257 A | | 7/1989 | Young et al. |

(List continued on next page.)

FOREIGN PATENT DOCUMENTS

| | | |
|---|---|---|
| DE | 3032608 | 3/1981 |
| EP | 0216246 | 4/1987 |
| EP | 0 474 289 A1 * | 3/1992 |
| EP | 0532260 | 3/1993 |
| JP | 5-283678 | 10/1993 |
| JP | 7-297298 | 11/1995 |

OTHER PUBLICATIONS

Guckel et al., "Advances in processing techniques for silicon micromechanical devices with smoot surfaces", MicroElectro Mechanical Systems, 1989, Proceedings, An Investigation of Micro Structures, Sensors, Actuators, Machines & Robots. IEEE, 1989, pp. 71–75.*

(List continued on next page.)

Primary Examiner—Eddie Lee
Assistant Examiner—José R Díaz
(74) Attorney, Agent, or Firm—Kevin L. Daffer; Conley, Rose & Tayon P.C.

(57) ABSTRACT

A method is presented for forming a transistor wherein polysilicon is preferably deposited upon a dielectric-covered substrate to form a sacrificial polysilicon layer. The sacrificial polysilicon layer may then be reduced to a desired thickness. Thickness reduction of the sacrificial polysilicon layer is preferably undertaken by oxidizing a portion of the sacrificial polysilicon layer and then etching the oxidized portion. As an option, the sacrificial polysilicon layer may be heated such that it is recrystallized. The sacrificial polysilicon layer is preferably annealed in a nitrogen-bearing ambient such that it is converted to a gate dielectric layer that includes nitride. Polysilicon may be deposited upon the gate dielectric layer, and select portions of the polysilicon may be removed to form a gate conductor. LDD and source/drain areas may be formed adjacent to the gate conductor.

24 Claims, 4 Drawing Sheets

U.S. PATENT DOCUMENTS

| | | |
|---|---|---|
| 4,866,002 A | 9/1989 | Shizukuishi et al. |
| 4,897,365 A | 1/1990 | Baldi et al. |
| 4,922,319 A | 5/1990 | Fukushima |
| 5,043,780 A | 8/1991 | Fazan et al. |
| 5,066,995 A | 11/1991 | Young et al. |
| 5,082,797 A | 1/1992 | Chan et al. |
| 5,102,832 A | 4/1992 | Tuttle |
| 5,138,411 A | 8/1992 | Sandhu |
| 5,141,882 A | 8/1992 | Komori et al. |
| 5,158,463 A | 10/1992 | Kim et al. |
| 5,172,200 A | 12/1992 | Muragishi et al. |
| 5,191,509 A | 3/1993 | Wen |
| 5,208,176 A | 5/1993 | Ahmad et al. |
| 5,250,456 A | 10/1993 | Bryant |
| 5,254,489 A | 10/1993 | Nakata |
| 5,258,333 A * | 11/1993 | Shappir et al. ............. 438/762 |
| 5,286,992 A | 2/1994 | Ahrens et al. |
| 5,308,787 A | 5/1994 | Hong et al. |
| 5,316,965 A | 5/1994 | Philipossian et al. |
| 5,330,920 A | 7/1994 | Soleimani et al. |
| 5,330,935 A | 7/1994 | Dobuzinsky et al. |
| 5,340,764 A | 8/1994 | Larsen et al. |
| 5,358,894 A | 10/1994 | Fazan et al. |
| 5,391,907 A | 2/1995 | Jang |
| 5,429,972 A | 7/1995 | Anjum et al. |
| 5,432,114 A | 7/1995 | O |
| 5,445,999 A * | 8/1995 | Thakur et al. ............. 438/396 |
| 5,480,828 A | 1/1996 | Hsu et al. |
| 5,502,009 A | 3/1996 | Lin |
| 5,538,923 A * | 7/1996 | Gardner et al. ............. 438/264 |
| 5,576,226 A | 11/1996 | Hwang |
| 5,576,266 A | 11/1996 | Flosenzier et al. |
| 5,576,570 A | 11/1996 | Ohsawa et al. |
| 5,597,754 A * | 1/1997 | Lou et al. ................... 438/398 |
| 5,786,256 A | 7/1998 | Gardner et al. |
| 5,789,305 A | 8/1998 | Peidous |
| 5,837,598 A * | 11/1998 | Aronowitz et al. ......... 438/532 |
| 5,851,888 A * | 12/1998 | Gardner et al. ............. 438/301 |
| 5,872,376 A | 2/1999 | Gardner et al. |
| 5,882,993 A | 3/1999 | Gardner et al. |
| 5,937,310 A | 8/1999 | Gardner et al. |
| 5,962,914 A | 10/1999 | Gardner et al. |
| 5,966,624 A * | 10/1999 | Shen .......................... 438/478 |
| 6,020,260 A * | 2/2000 | Gardner ...................... 438/657 |
| 6,040,207 A | 3/2000 | Gardner et al. |
| 6,060,403 A * | 5/2000 | Yasuda et al. ............. 438/765 |
| 6,087,229 A * | 7/2000 | Aronowitz et al. ......... 438/287 |
| 6,258,690 B1 * | 7/2001 | Zenke ........................ 438/396 |

OTHER PUBLICATIONS

Wolfe, S., "Silicon Processing For The VLSI Era," vol. 3: The Submicron MOSFET, Lattice Press, CA, 1995, pp. 495–496.

Wolfe, et al., "Silicon Processing For The VLSI Era," vol. 1: Process Technology, Lattice Press, 1986, pp. 429–446.

Naito et al., "Effect of Bottom Oxide on the Integrity of Interpolysilicon Ultrathin ONO Films," *Journal of the Electrochemical Society*, vol. 137, No. 2, Feb. 1, 1990, pp. 635–638.

Abbas et al., "Improvement of the Gate–Region Integrity in FET Devices," *IBM Technical Disclosure Bulletin*, vol. 14, No. 11, Apr. 1972, pp. 3348–3350.

Cheung, "Plasma Immersion Ion Implantation for ULSI Processing," *Trends & Applications*, 1991, pp. 811–820.

Wolf et al., "Silicon Processing for the VLSI Era, vol. 1, Process Technology," pp. 198–218.

Patent Abstracts of Japan, Publication No. 01183844, Publication Date Jul. 21, 1989, Application Date Jan. 19, 1988, Application No. 63008901.

Scott et al., "Blocking of Silicon Oxidation by Low–Dose Nitrogen Implantation," *Applied Physics A/Solids & Surfaces*, vol. A45, No. 1, Jan. 1, 1988, pp. 73–76.

Wolf et al., "Silicon Processing for the VLSI Era, vol. 1, Process Technology," p. 321.

Molle et al., "Nitrogen Implantation for Local Oxidation of Silicon," *Nuclear Instruments & Methods in Physics Research, Section B*, vol. B55, Nos. 1, 4, Apr. 2, 1991, pp. 860–865.

Kuroi et al., "Novel NICE Structure for High Reliability and High Performance 0.25 micron Dual Gate CMOS," *IEDM*, pp. 325–328.

Ahn et al., "High Quality Ultrathin Gate Dielectrics Formation by Thermal Oxidation of Si in $N_2O$," *J. Electrochem. Soc.*, vol. 138, No. 9, Sep. 1991, pp. L39–L41.

Doyle et al., "Simultaneous Growth of Different Thickness Gate Oxides in Silicon CMOS Processing," *IEEE Electron Device Letters*, vol. 16, No. 7, Jul. 1995, pp. 301–302.

Philipossian et al., "Kinetics of Oxide Growth during Reoxidation of Lightly Nitrided Oxides," *J. Electrochem. Soc.*, vol. 139, No. 9, Sep. 1992, pp. L82–L83.

* cited by examiner

ADVANCED FABRICATION TECHNIQUE TO FORM ULTRA THIN GATE DIELECTRIC USING A SACRIFICIAL POLYSILICON SEED LAYER

BACKGROUND OF THE INVENTION

1. Field of the Invention

This invention relates to semiconductor processing and, more particularly, to an improved transistor and a method for forming an improved transistor having an ultra thin, high K value, gate dielectric.

2. Description of the Related Art

Fabrication of a metal oxide semiconductor field-effect transistor (MOSFET) device is well known. Generally speaking, MOSFETs are manufactured by placing an undoped polycrystalline silicon ("polysilicon") material over a relatively thin gate oxide. The polysilicon material and the gate oxide are then patterned to form a gate conductor with source/drain regions adjacent to and on opposite sides of the gate conductor. The gate conductor serves to self-align impurities forwarded into the substrate on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits use either n-channel devices exclusively, p-channel devices exclusively, or a combination of both on a single substrate. The combination of an n-channel and a p-channel device on a single substrate is termed a complementary MOS ("CMOS") device.

Because of the increased desire to build faster and more complex integrated circuits, it has become necessary to reduce the transistor threshold voltage, $V_T$. Several factors contribute to $V_T$, one of which is the gate-to-substrate capacitance. $V_T$ of a transistor decreases as the gate-to-substrate capacitance increases. The capacitance per unit area, $C_{ox}$, of a gate dielectric can be expressed as:

$$C_{ox} = \in / t_{ox}$$

where $\in$ is the permittivity the gate oxide and $t_{ox}$ is the thickness of the gate oxide. The above equation for $C_{ox}$ demonstrates that the capacitance between two layers of conductive material separated by a dielectric is directly proportional to the permittivity of the dielectric and inversely proportional to the thickness of the dielectric.

By normalizing the permittivity, $\in$, of a material to the permittivity of vacuum, $\in_o$, the relative permittivity of a material can be determined. Relative permittivity, or dielectric constant, K, is typically used in place of permittivity. The dielectric constant of a material is defined as:

$$K = \in / \in_o$$

Silicon dioxide ("oxide") has a relatively low K of approximately 3.7 to 3.8. Consequently, the minimum value of $V_T$, and thus the transistor switching speed, is limited by the need to maintain a certain gate oxide thickness in order to promote capacitive coupling between the gate conductor and the substrate.

Because of the relationship between gate oxide thickness and threshold voltage, conventional transistors typically include an ultra thin gate oxide to increase the gate-to-substrate capacitance, and thereby lower $V_T$. The value of the gate-to-source voltage, $V_{GS}$, required to invert the channel underneath the gate conductor such that a drive current, $I_D$, flows between the source and drain regions of the transistor is decreased. Consequently, the switching speed (from off to on and vice versa) of the logic gates of an integrated circuit employing such transistors is faster, allowing the integrated circuit to quickly transition between logic states (i.e., operate at high frequencies).

Unfortunately, thin oxide films may break down when subjected to an electric field. Particularly, for a gate oxide that is less than 50 Å thick, it is probable that when $V_{GS}$ is equivalent to only 3V, electrons can pass through the gate oxide by what is known as the quantum mechanical tunneling effect. In this manner, a tunneling current may undesirably form between the semiconductor substrate and the gate conductor, adversely affecting the operability of the device. It is postulated that these electrons may become entrapped within the gate oxide by, e.g., dangling bonds. Consequently, a net negative charge density may form in the gate oxide. As the trapped charge accumulates with time, $V_T$ may shift from its design specification. Breakdown of the gate oxide may also occur at even lower values of $V_{GS}$ because of defects in the gate oxide. Such defects are unfortunately prevalent in relatively thin gate oxides. For example, a thin gate oxide often contains pinholes and/or localized voids due to the unevenness at which the oxide grows on a less than perfect silicon lattice. Low breakdown voltages also correlate with high defect density near the surface of the substrate.

In addition, the gate electrode is typically made from deposited polysilicon (as stated above). To lower the resistivity of the polysilicon gate, and thus increase the speed of the transistor, it is desirable that the entire polysilicon layer forming the gate be substantially doped. During a conventional transistor formation process, the polysilicon gate is typically doped at the same time as the source/drain areas in order to make the process more efficient. This simultaneous implantation may cause difficulties since the implant depth required for the gate is typically deeper than the desired implant depth of the source/drain areas. Moreover, dopants residing in the gate conductor may eventually traverse the gate dielectric and enter the channel region, causing threshold skew. In particular, the boron commonly used to dope p+ gates readily migrates though a thin gate oxide (less than 125 angstroms) under high temperature processes (e.g., annealing at 900° C.). In order to avoid this migration, processing temperatures must be lowered. Such lowering, however, may result in insufficient distribution and/or anneal of implanted dopants.

In order to resolve the problems described above, the use of a high-quality gate dielectric (i.e., one that is resistant to breakdown, has a high K value, etc.) is desired. High K value materials, such as silicon nitride ("nitride"), are sometimes used as the gate dielectric. Since nitride has a K value of about 8, a gate dielectric composed of nitride can be made thicker than a gate oxide while maintaining the equivalent gate-to-substrate capacitance. The increased thickness of a nitride gate dielectric relative to a similarly performing gate oxide helps to make the nitride gate dielectric more resistant to breakdown. Also, nitride is relatively impermeable to foreign species such as oxygen, and therefore provides an effective barrier against diffusion.

There are numerous problems, however, with many conventional techniques for implementing nitride gate dielectrics. Because of the mechanical stresses that develop at the silicon/silicon nitride interface, it is generally disadvantageous to deposit nitride directly upon a silicon wafer.

Moreover, many methods of nitride deposition result in the formation of a nitride layer that is uneven, nonstoichiometric, and filled with pinholes. Such a nitride layer might contain, among other things, diffusion pathways through which dopants and electrons may undesirably pass.

Therefore, it would be desirable to develop a technique for fabricating a transistor composed of a high-quality gate dielectric. A high-quality gate dielectric would afford increased gate-to-substrate capacitance while being substantially resistant to breakdown. The improved technique would be one that avoids the problems of very thin oxides, yet provides high-speed operation necessary for modem integrated circuits. Tunneling currents formed between the gate dielectric and the gate conductor would be minimized along with the possibility of electrons becoming trapped within the gate dielectric. Migration of dopants from the gate electrode into the channel region would be substantially reduced over a conventional gate oxide. The transistor would thus be substantially resistant to threshold skews from the desired value of $V_T$.

SUMMARY OF THE INVENTION

The problems identified above are in large part addressed by the technique hereof for forming an improved transistor. The present invention contemplates a transistor in which the gate dielectric layer includes a nitride layer. The nitride layer is formed by annealing a sacrificial polysilicon seed layer in a nitrogen-bearing ambient. The thickness of the polysilicon seed layer can easily be scaled to achieve precise control over the thickness of the nitride layer. Thermal growth of the nitride layer from the polysilicon seed layer preferably results in a nitride dielectric layer that has fewer electron traps than a deposited nitride layer. Because the K value of nitride is higher than that of oxide, a nitride gate dielectric that is thicker than a gate oxide can obtain similar capacitive coupling performance. In addition, thermally grown nitride is stoichiometric and contains strong Si—N bonds, which makes it an excellent diffusion barrier layer. The presence of the nitride layer beneath the gate electrode, therefore, helps prevent migration of dopants from the gate electrode into the channel region. Before the sacrificial polysilicon layer is annealed in a nitrogen-bearing ambient, it may be heated such that it is recrystallized. Recrystallization of the sacrificial polysilicon layer preferably increases the quality of any oxide or nitride layers grown from it. Preferably, the final gate dielectric is more resistant to breakdown and is more effective at preventing threshold skew than a comparatively thin deposited nitride gate dielectric or a conventional gate dielectric that only includes oxide.

According to one embodiment, the sacrificial polysilicon layer used to form the nitride is deposited upon a dielectric layer that covers a single crystal silicon substrate. As stated above, the silicon/silicon nitride interface is poor. Depositing silicon nitride directly onto a silicon surface creates high tensile stresses that can exceed the critical stress for dislocation generation in silicon. The dielectric layer, which may be composed of oxide, preferably serves as a buffer or "pad" to reduce these stresses. Moreover, the silicon/silicon oxide interface is well understood and, in terms of the amount of interface fixed charges and traps, superior to the silicon/silicon nitride interface. After growth or deposition, the dielectric layer may be etched to reduce its thickness. Preferably, the dielectric layer is thick enough to serve as a pad for the nitride layer, yet sufficiently thin that its lower K value (relative to nitride) does not negatively impact the overall gate-to-substrate capacitance of the final gate dielectric.

As stated above, growth of the nitride from the sacrificial polysilicon layer affords more control over the thickness of the nitride than do conventional deposition techniques. Depositing a uniformly thin nitride layer is difficult, and the resulting film typically has numerous pinholes. By annealing the polysilicon seed layer in a nitrogen-bearing ambient, a uniformly thin, high quality nitride layer may be formed. Forming the nitride layer includes the steps of depositing polysilicon, oxidizing an upper portion of the polysilicon, and etching the oxidized portion. These steps may be repeated until a desired thickness of the sacrificial polysilicon layer is achieved.

There are numerous benefits to recrystallizing the sacrificial polysilicon layer. Polysilicon thin films are made of small single crystal regions (grains) separated by grain boundaries. Although the grain boundaries are made up of disordered atoms, atoms within the grains are arranged in a periodic structure. Increasing the size of the grains within a layer of polysilicon advantageously allows its structure and properties to approach those of a layer of single crystal silicon. The structure and properties of polysilicon are highly dependent, among other things, on the temperature during deposition and any subsequent steps. By keeping the temperature below about 580° C., polysilicon may be deposited in the amorphous phase. Temperatures above 580° C. generally lead to deposition of polysilicon in the polycrystalline phase. Recrystallization of a deposited polysilicon layer causes growth of the size of grains and reduction of the extent of grain boundaries. Although higher deposition temperatures result in larger initial grain size, the final, post-recrystallization grain size tends to increase as deposition temperature decreases. In addition, the structural uniformity of a recrystallized amorphous layer is generally superior to that of a recrystallized polycrystalline silicon layer.

Another impetus for recrystallization is to improve the quality of any oxide or nitride layers grown from the sacrificial polysilicon layer. The breakdown strength of a thermally grown oxide or nitride layer is highly dependent on the smoothness of the surface of the polysilicon layer from which the layer is grown. Recrystallization of the sacrificial polysilicon layer, especially if it is deposited in the amorphous phase, may result in a substantial increase in the surface quality of the sacrificial polysilicon layer over a polysilicon layer that has not been recrystallized.

Broadly speaking, a method is presented for forming a transistor wherein polysilicon is preferably deposited upon a dielectric-covered substrate to form a sacrificial polysilicon layer. The sacrificial polysilicon layer may then be reduced to a desired thickness. Thickness reduction of the sacrificial polysilicon layer is preferably undertaken by oxidizing a portion of the sacrificial polysilicon layer and then etching the oxidized portion. The remaining sacrificial polysilicon layer may then be annealed in a nitrogen-bearing ambient such that it is converted to a gate dielectric layer that includes nitride. Non-sacrificial polysilicon may then be deposited upon the nitride-embodied gate dielectric layer, and select portions of the polysilicon may be removed to form a gate conductor. Lightly doped drain ("LDD") and source/drain areas may be formed adjacent to the gate conductor.

According to another embodiment, a layer of oxide preferably is grown upon a single crystal silicon substrate. Growth of the layer of oxide may be undertaken in a nitrogen-bearing ambient such that the layer of oxide includes a substantial quantity of nitrogen atoms distributed throughout. A sacrificial polysilicon layer is then formed upon the layer of oxide. By varying the temperature at which the polysilicon is deposited, the sacrificial polysilicon layer may be formed in either an amorphous or a polycrystalline phase. A portion of the sacrificial polysilicon layer is preferably oxidized and etched away to reduce its thickness. The sacrificial polysilicon layer may be heated for recrystallization purposes. Annealing of the sacrificial polysilicon layer in a nitrogen-bearing ambient is preferably carried out such that the sacrificial polysilicon layer is converted into a layer of nitride. A gate structure may be patterned and LDD and source/drain areas formed. The final transistor preferably includes a gate dielectric with a high K value such that it provides good gate-to-substrate capacitive coupling without breakdown problems.

BRIEF DESCRIPTION OF THE DRAWINGS

Other objects and advantages of the invention will become apparent upon reading the following detailed description and upon reference to the accompanying drawings in which.

Figure 1:
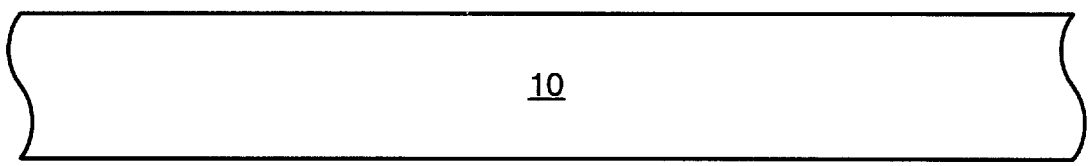
FIG. 1 is a partial cross-sectional view of a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, a semiconductor substrate 10 is provided which is composed of single crystal silicon. Although not shown in the depicted cross-section of substrate 10, dielectric isolation regions, such as trench isolation structures, may be arranged spaced distances apart within the substrate for dielectrically isolating ensuing active areas.

Figure 2:
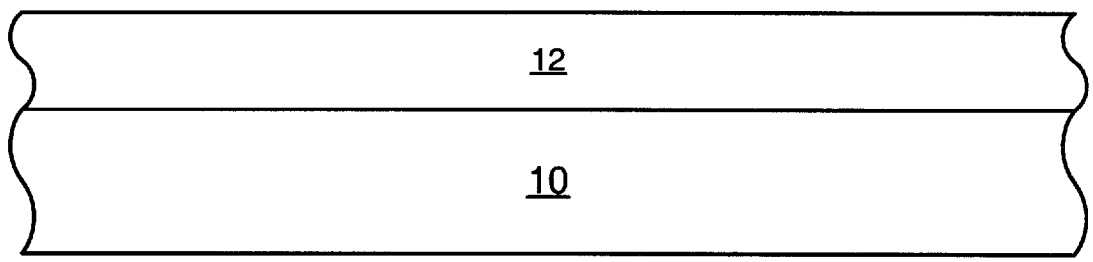
FIG. 2 is a partial cross-sectional view of the semiconductor topography, wherein a layer of oxide is formed upon a semiconductor substrate according to an initial processing step subsequent to FIG. 1.

Turning to FIG. 2, a dielectric layer 12 is formed entirely across substrate 10. Dielectric layer 12 preferably comprises oxide, and is either deposited or grown from a heated, oxygen-bearing source. In an embodiment in which the oxide is grown, the ambient may be pure oxygen. Alternately, the ambient in which the oxide is grown may contain nitrogen (e.g., NO and/or $N_2O$ gas may be present). Dielectric layer 12, if grown in the presence of nitrogen, may contain between 1–4 percent nitrogen distributed throughout. Nitrogen within dielectric layer 12 preferably acts as a barrier to dopant migration. Initially, dielectric layer 12 may have a thickness of 15–30 angstroms, but could be much thicker. The method of oxidation is preferably a rapid thermal oxidation at temperatures ranging from 900°–1050° C. for 5–30 seconds. The oxidation may also occur in a tube furnace using temperatures between 700° and 850° C. for 5–20 min.

Figure 3:
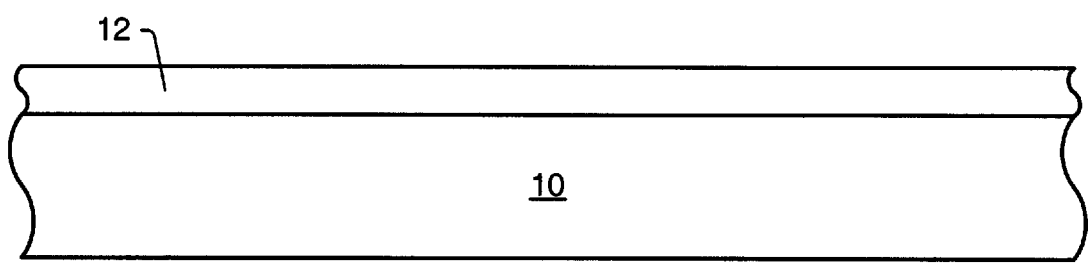
FIG. 3 is a partial cross-sectional view of the semiconductor topography, wherein an upper portion of the layer of oxide is removed according to a processing step subsequent to FIG. 2.

Turning to FIG. 3, the thickness of dielectric layer 12 is preferably reduced to a uniform thickness of approximately 1 to 2 monolayers or 3 to 6 angstroms. This is preferably accomplished by a wet etch utilizing a 100:1 $H_2O:HF$ dip, which should remove dielectric layer 12 at a rate of approximately 1 angstrom per sec. Other methods, such as chemical-mechanical polishing, may also be used to reduce the thickness of dielectric layer 12.

Figure 4:
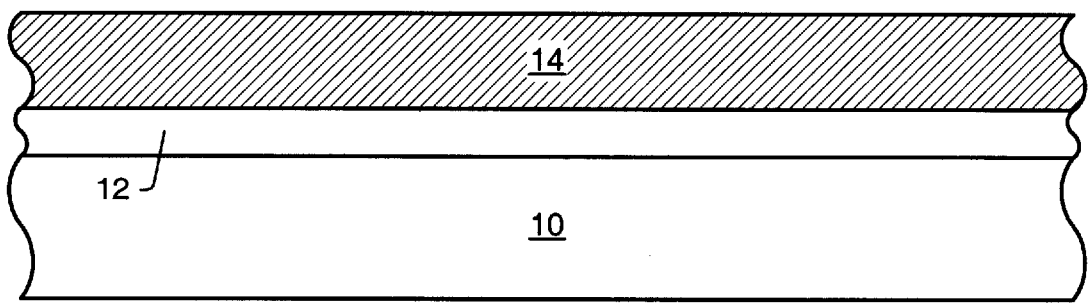
FIG. 4 is a partial cross-sectional view of the semiconductor topography, wherein a sacrificial layer of polysilicon is deposited according to a processing step subsequent to FIG. 3.

Turning to FIG. 4, polysilicon is preferably deposited across dielectric layer 12 to form sacrificial polysilicon layer 14. Deposition may occur by, for example, chemical vapor deposition ("CVD") from a silane source. Sacrificial polysilicon layer 14 is preferably 30–100 angstroms thick after deposition. By varying the temperature of deposition, sacrificial polysilicon layer 14 may be deposited in either a polycrystalline or an amorphous phase. If the deposition temperature is maintained below about 580° C., polysilicon may be deposited in the amorphous phase. Conversely, temperatures above 580° C. generally lead to deposition in the polycrystalline phase. Sacrificial polysilicon layer 14 is preferably deposited in the amorphous phase.

Figure 5:
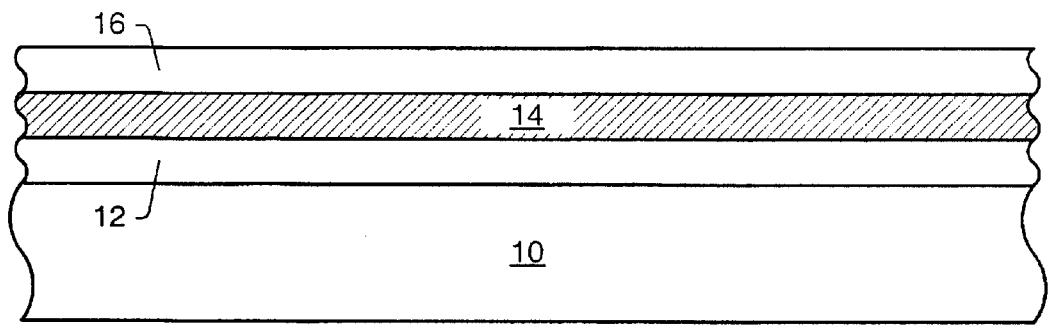
FIG. 5 is a partial cross-sectional view of the semiconductor topography, wherein a portion of the sacrificial polysilicon layer is oxidized according to a processing step subsequent to FIG. 4.

Turning to FIG. 5, a portion of sacrificial polysilicon layer 14 preferably is oxidized to form oxidized portion 16. The oxidation may occur, for example, either in a rapid thermal processing (RTP) chamber or in a tube furnace. Oxidation is preferably carried out to the extent that only 5–15 angstroms of sacrificial polysilicon layer 14 remain unoxidized.

Figure 6:
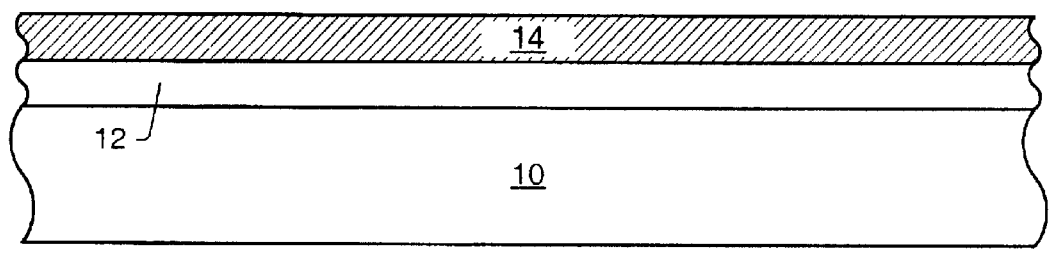
FIG. 6 is a partial cross-sectional view of the semiconductor topography, wherein the oxidized portion of the sacrificial polysilicon layer is removed according to a processing step subsequent to FIG. 5.

Turning to FIG. 6, the oxidized portion 16 is etched such that it is substantially, if not entirely, removed. An etching chemistry that is highly selective to oxide over silicon may be used. A wet etch using a 10:1 $H_2O$:HF dip is preferred. The steps of deposition, oxidation, and etching may be repeated as necessary to precisely control the thickness of sacrificial polysilicon layer 14.

Figure 7:
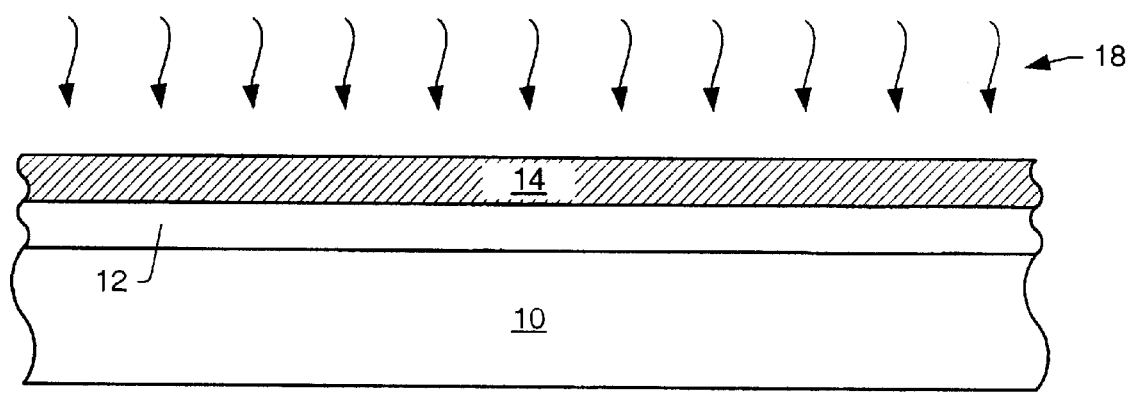
FIG. 7 is a partial cross-sectional view of the semiconductor topography, wherein the sacrificial polysilicon layer may be recrystallized according to a processing step subsequent to FIG. 6.

FIG. 7 illustrates an optional heating process in which sacrificial polysilicon layer 14 may be exposed to thermal radiation 18. Preferably, sacrificial polysilicon layer 14 is annealed at 500–800° C. for 2–6 hours to effect recrystallization. Recrystallization of sacrificial polysilicon layer 14 may occur at a variety of points during the process sequence. Preferably, recrystallization of sacrificial polysilicon layer causes growth of the size of grains and reduction of the extent (or number) of grain boundaries within the layer.

Figure 8:
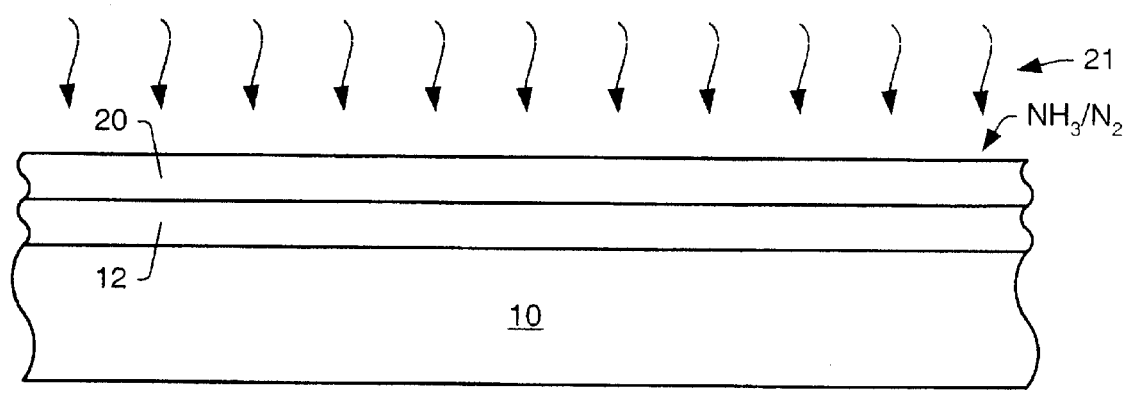
FIG. 8 is a partial cross-sectional view of the semiconductor topography, wherein the sacrificial polysilicon layer is converted to a layer of nitride according to a processing step subsequent to FIG. 7.

Turning to FIG. 8, sacrificial (recrystallized or non-recrystallized) polysilicon layer 14 preferably is exposed to thermal radiation 21 in the presence of a nitrogen-bearing ambient. Annealing preferably occurs in a RTP chamber at 900–1150° C. for 10–120 seconds such that sacrificial polysilicon layer 14 is substantially converted to nitride layer 20. As stated above, the ambient in which annealing is carried out is preferably nitrogen-bearing, and may contain, for example, $N_2$ and/or $NH_3$ gas. Nitride layer 20 preferably is formed entirely from conversion of sacrificial polysilicon layer 14. Therefore, the final thickness of nitride layer 20 is preferably limited by the pre-annealing thickness of sacrificial polysilicon layer 14. As sacrificial polysilicon layer 14 is preferably 5–15 angstroms thick before annealing, nitride layer 20 may be about 5–15 angstroms thick after conversion is completed. Since the K values of oxide and nitride are about 4 and 8, respectively, 5–15 angstroms of nitride have an equivalent oxide thickness (similar capacitive coupling performance) of 2.5–7.5 angstroms. As noted earlier, dielectric layer 12 preferably is 3–6 angstroms thick and is composed of oxide. The gate dielectric that results from subsequent patterning will preferably include portions of nitride layer 20 and dielectric layer 12. The capacitance per unit area of the final gate dielectric will depend, by the formulas given above, on the respective K value and thickness of each layer that makes up the gate dielectric. Consequently, the final gate dielectric preferably has a capacitance per unit area equivalent to 5–15 angstroms of oxide.

Figure 9:
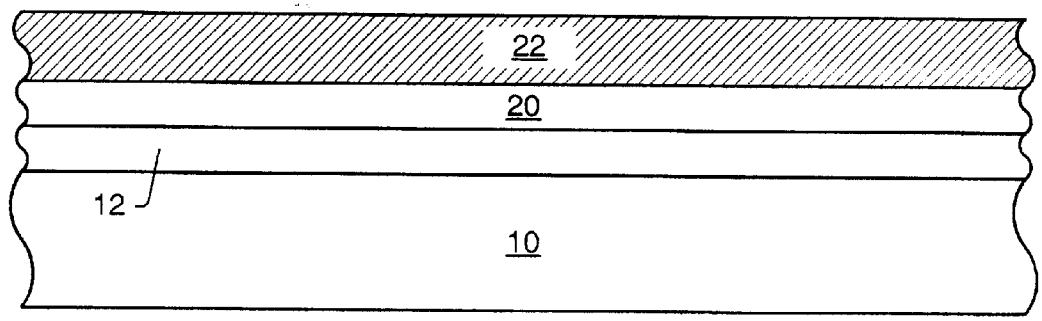
FIG. 9 is a partial cross-sectional view of the semiconductor topography, wherein a layer of polysilicon is deposited according to a processing step subsequent to FIG. 8.

Turning to FIG. 9, polysilicon may be CVD deposited across nitride layer 20 to form polysilicon layer 22. Polysilicon layer 22 preferably is rendered conductive through dopant implantation in a subsequent process step.

Figure 10:
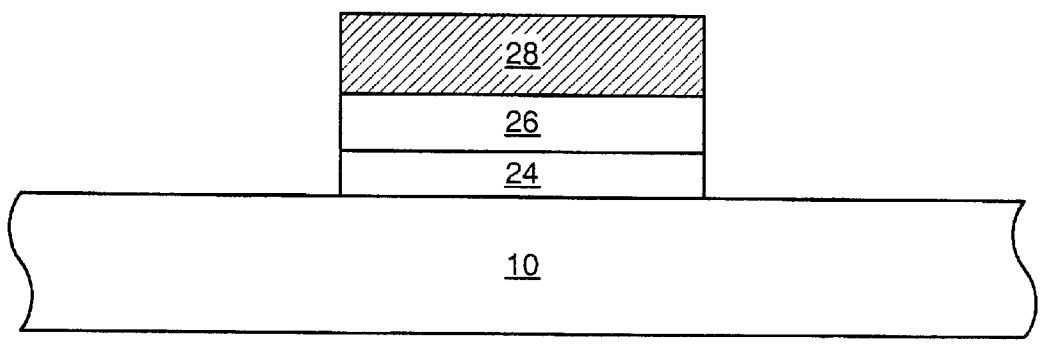
FIG. 10 is a partial cross-sectional view of the semiconductor topography, wherein the layer of polysilicon, the layer of nitride, and the layer of oxide are patterned to define a gate structure according to a processing step subsequent to FIG. 9.

Turning to FIG. 10, portions of polysilicon layer 22, nitride layer 20, and dielectric layer 12 may be removed to form a gate structure defined between a pair of opposed sidewall surfaces. Gate conductor 28 (formed from polysilicon layer 22) preferably lies above a nitride gate dielectric 26 (formed from nitride layer 20) and an oxide dielectric 24 (formed from dielectric layer 12). Removal of the above-described portions may involve optical lithography and a plasma etch which is terminated before substantial portions of the surface of semiconductor substrate 10 are removed.

Figure 11:
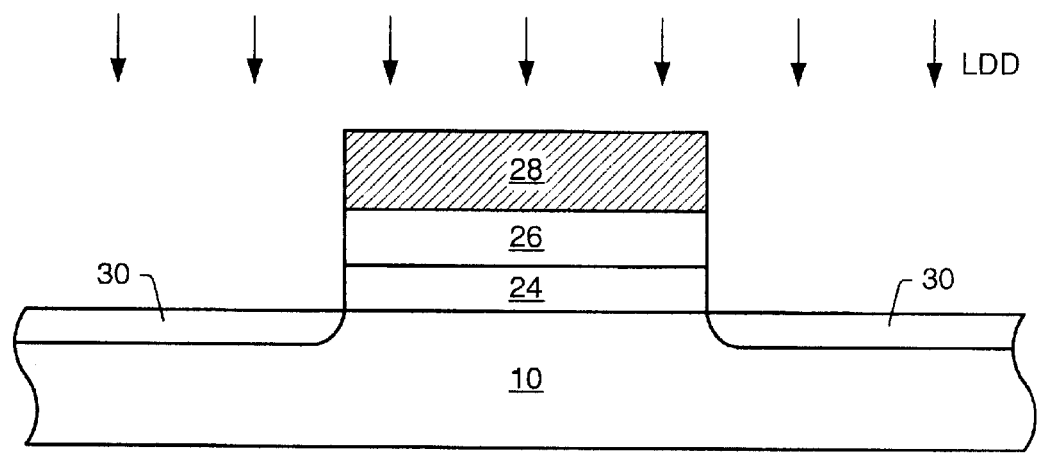
FIG. 11 is a partial cross-sectional view of the semiconductor topography, wherein a LDD implant that is self-aligned to the sidewalls of the gate structure is forwarded to the semiconductor topography according to a processing step subsequent to FIG. 10.

As shown in FIG. 11, an LDD implant may then be forwarded to semiconductor substrate 10. The LDD implant is preferably aligned to the opposed sidewall surfaces of gate conductor 28. Consequently, LDD areas 30 are formed within regions of substrate 10 not masked by gate conductor 28 and exclusive of isolation regions. The LDD areas 30 preferably contain a light concentration of dopants that are opposite in type to the dopants implanted within the bulk of substrate 10. During the LDD implant step, as well as any subsequent implant steps, dopants may be forwarded into gate conductor 28. With a conventional thin gate oxide, dopants may readily pass through the oxide and enter the underlying channel region. As stated above, this may result, undesirably, in threshold skew. The presence of nitride dielectric 26, along with oxide dielectric 24 (if it contains a substantial amount of nitrogen), substantially prevents dopant migration through the gate dielectric.

Figure 12:
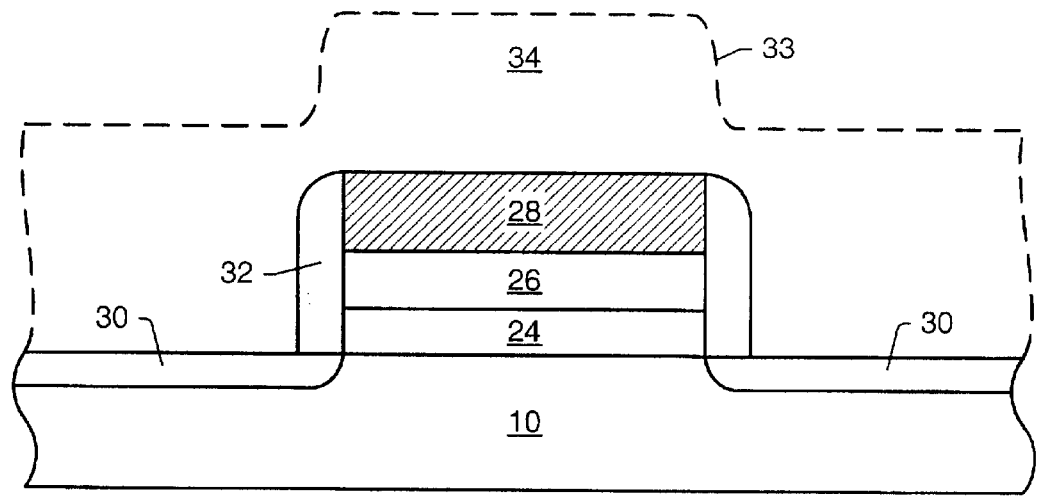
FIG. 12 is a partial cross-sectional view of the semiconductor topography, wherein dielectric spacers are formed on the sidewalls of the gate structure according to a processing step subsequent to FIG. 11.

Turning to FIG. 12, a dielectric material 33, such as oxide or nitride, may then be CVD deposited across exposed portions of substrate 10 and gate conductor 28. An anisotropic etch in which ion ablation occurs more quickly upon horizontal surfaces than vertical surfaces may then be performed to remove portion 34 of the dielectric material. Dielectric spacers 32 are thus formed upon the opposed sidewall surfaces of the gate structure.

Figure 13:
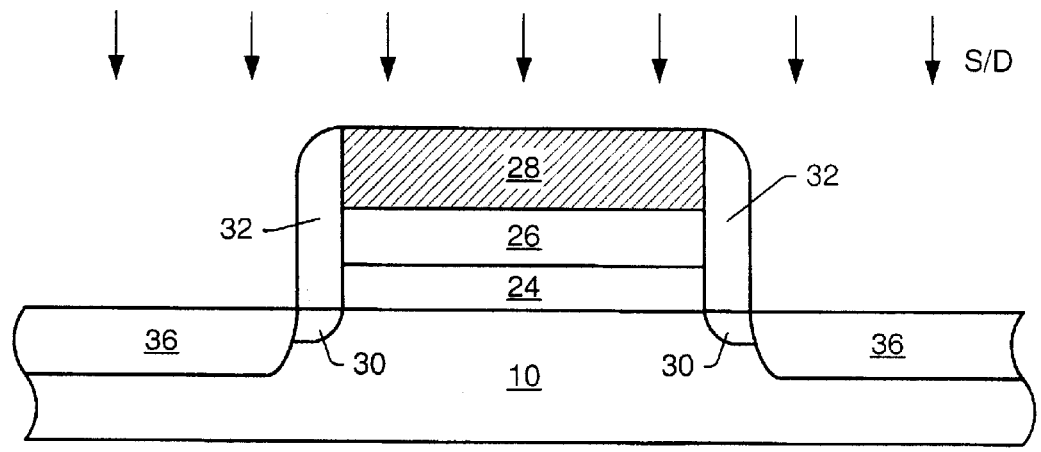
FIG. 13 is a partial cross-sectional view of the semiconductor topography, wherein a source/drain implant that is self-aligned to the exposed lateral surface of the dielectric spacers is forwarded to the semiconductor topography according to a processing step subsequent to FIG. 12.

In FIG. 13, a heavy concentration source/drain ("S/D") implant is self-aligned to the exposed lateral surfaces of dielectric spacers 32. The dopants used for the S/D implant are of the same type as those used for the LDD implant. Preferably, if a p-channel transistor is being formed, ion implantation of p-type species is used. On the other hand, if an n-channel transistor is being formed, n-type species are implanted into substrate 10. Some commonly used n-type dopants are arsenic or phosphorus, and some commonly used p-type dopants are boron or boron difluoride. The resulting transistor has graded junctions in which dopant concentration increases laterally in a direction away from gate conductor 28. In other words, S/D regions 36 are formed within semiconductor substrate 10 that are more heavily concentrated with dopants than LDD areas 30.

It will be appreciated to those skilled in the art having the benefit of this disclosure that this invention is believed to provide a method for forming a transistor having a high K value gate dielectric that is resistant to breakdown yet achieves high performance characteristics. Further modifications and alternative embodiments of various aspects of the invention will be apparent to those skilled in the art in view of this description. For example, multiple transistors may be formed upon and within the semiconductor substrate between isolation regions, contacts may be made to the transistors, and interconnect routing isolated above the transistors may be formed between the contacts. It is intended that the following claims be interpreted to embrace all such modifications and changes and, accordingly, the specification and drawings are to be regarded in an illustrative rather than a restrictive sense.

What is claimed is:

1. A method for forming a semiconductor device, comprising:

forming a sacrificial polysilicon layer upon a dielectric-covered substrate;

reducing a thickness of the sacrificial polysilicon layer by removing an upper portion of the sacrificial polysilicon layer;

converting the sacrificial polysilicon layer into a silicon nitride layer; and patterning a gate electrode above the silicon nitride layer.

2. The method as recited in claim 1, wherein forming the sacrificial polysilicon layer comprises depositing polysilicon upon the dielectric-covered substrate to form the sacrificial polysilicon layer.

3. The method as recited in claim 2, wherein said reducing the thickness of the sacrificial polysilicon layer comprises:
   oxidizing a portion of the sacrificial polysilicon layer; and
   removing the oxidized portion of the sacrificial polysilicon layer by an etch process, such that the thickness of the sacrificial polysilicon layer is reduced.

4. The method of claim 3, wherein said patterning a gate electrode comprises patterning the gate electrode above a portion of the substrate from above which the oxidized portion of the sacrificial polysilicon layer was removed.

5. The method as recited in claim 2, wherein said step of forming the sacrificial polysilicon layer is repeated to control the thickness of the sacrificial polysilicon layer.

6. The method of claim 2, wherein the dielectric-covered substrate comprises a covering dielectric layer above the substrate, and wherein said depositing polysilicon upon the dielectric-covered substrate comprises depositing polysilicon upon the covering dielectric layer such that the sacrificial polysilicon layer is thicker than the covering dielectric layer.

7. The method as recited in claim 1, wherein said forming the sacrificial polysilicon layer comprises depositing amorphous polysilicon upon the dielectric-covered substrate.

8. The method as recited in claim 1, further comprising reducing the thickness of the sacrificial polysilicon layer to between 5 and 15 angstroms prior to said converting.

9. The method as recited in claim 1, wherein said patterning a gate electrode comprises:
   depositing a layer of polysilicon; and
   removing select portions of the layer of polysilicon.

10. The method as recited in claim 1, further comprising heating the sacrificial polysilicon layer to recrystallize the sacrificial polysilicon layer.

11. The method as recited in claim 1, wherein the dielectric-covered substrate comprises an oxide dielectric, and further comprising reducing the thickness of the oxide dielectric.

12. The method as recited in claim 11, wherein said reducing the thickness of the oxide dielectric comprises etching the oxide dielectric until it is 3–6 angstroms thick.

13. The method of claim 1, wherein said converting comprises annealing the sacrificial polysilicon layer in a nitrogen-bearing ambient.

14. The method of claim 13, wherein said annealing is performed at a temperature of greater than 900° C. and for a duration between 10 and 120 seconds.

15. The method of claim 1, wherein the substrate is a semiconductor substrate.

16. The method of claim 1, wherein immediately after said converting, the silicon nitride layer is approximately 5–15 angstroms thick.

17. The method of claim 1, wherein a gate dielectric layer interposed between and in contact with the gate electrode and the dielectric-covered substrate consists essentially of nitride after said converting.

18. A method for forming a semiconductor device, comprising:
   growing a layer of oxide upon a single crystal silicon substrate;
   forming a sacrificial polysilicon layer upon the layer of oxide;
   oxidizing a portion of the sacrificial polysilicon layer;
   removing the oxidized portion of the sacrificial polysilicon layer; and
   annealing the sacrificial polysilicon layer in a nitrogen-bearing ambient to form a layer of silicon nitride.

19. The method as recited in claim 18, further comprising heating the sacrificial polysilicon layer to recrystallize the sacrificial polysilicon layer.

20. The method as recited in claim 18, wherein said forming a sacrificial polysilicon layer comprises depositing amorphous polysilicon.

21. The method as recited in claim 18, wherein said removing the oxidized portion of the sacrificial polysilicon layer continues until the sacrificial polysilicon layer is 5–15 angstroms thick.

22. The method as recited in claim 18, wherein said growing a layer of oxide occurs in a nitrogen-bearing ambient such that the layer of oxide comprises nitrogen atoms.

23. The method of claim 18, further comprising patterning a gate electrode above a portion of the single crystal silicon substrate from above which the oxidized portion of the sacrificial polysilicon layer was removed.

24. The method of claim 18, wherein said annealing is performed at a temperature greater than 900° C. and for a duration between 10 and 120 seconds.

\* \* \* \* \*